(12) United States Patent
Lin et al.

(10) Patent No.: US 12,171,092 B2
(45) Date of Patent: Dec. 17, 2024

(54) LAYOUT OF STATIC RANDOM ACCESS MEMORY PERIPHERY CIRCUIT

(71) Applicant: Taiwan Semiconductor MAnufacturing Company, Ltd., Hsinchu (TW)

(72) Inventors: Yangsyu Lin, New Taipei (TW); Chi-Lung Lee, New Taipei (TW); Chien Chi Tien, Hsinchu (TW); Chiting Cheng, Taiching (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/506,122

(22) Filed: Nov. 9, 2023

(65) Prior Publication Data
US 2024/0074136 A1    Feb. 29, 2024

Related U.S. Application Data

(63) Continuation of application No. 17/751,426, filed on May 23, 2022, now Pat. No. 11,856,747, which is a (Continued)

(51) Int. Cl.
*H10B 10/00* (2023.01)
*G11C 11/412* (2006.01)
(Continued)

(52) U.S. Cl.
CPC ............ *H10B 10/18* (2023.02); *G11C 11/412* (2013.01); *G11C 11/419* (2013.01);
(Continued)

(58) Field of Classification Search
CPC ..... H10B 10/18; H10B 10/12; H01L 27/1116; H01L 27/0207; H01L 27/0924;
(Continued)

(56) References Cited

U.S. PATENT DOCUMENTS 5,903,036 A    5/1999  Onozawa
7,495,279 B2   2/2009  Shum et al.
(Continued)

FOREIGN PATENT DOCUMENTS

| CN | 101232038 A | 7/2008 |
|----|-------------|--------|
| CN | 108122916 A | 6/2018 |
| TW | 201824347 A | 7/2018 |

OTHER PUBLICATIONS

Taiwanese Office Action issued in corresponding Taiwan Patent Application No. 10920370970, dated Apr. 28, 2020.
(Continued)

*Primary Examiner* — Tu-Tu V Ho
(74) *Attorney, Agent, or Firm* — STUDEBAKER & BRACKETT PC

(57) ABSTRACT

A static random access memory (SRAM) periphery circuit includes a first n-type transistor and a second n-type transistor that are disposed in a first well region of first conductivity type, the first well region occupies a first distance in a row direction equal to a bitcell-pitch of an SRAM array. The SRAM periphery circuit includes a first p-type transistor and a second p-type transistor that are disposed in a second well region of second conductivity type. The second well region occupies a second distance in the row direction equal to the bitcell-pitch of the SRAM array. The second well region is disposed adjacent to the first well region in the row direction.

20 Claims, 10 Drawing Sheets

Related U.S. Application Data continuation of application No. 17/080,617, filed on Oct. 26, 2020, now Pat. No. 11,342,340, which is a continuation of application No. 16/502,790, filed on Jul. 3, 2019, now Pat. No. 10,818,677.

(60) Provisional application No. 62/715,529, filed on Aug. 7, 2018, provisional application No. 62/698,702, filed on Jul. 16, 2018.

(51) Int. Cl.
  *G11C 11/419* (2006.01)
  *H01L 23/522* (2006.01)
  *H01L 23/528* (2006.01)
  *H01L 27/02* (2006.01)
  *H01L 27/092* (2006.01)

(52) U.S. Cl.
  CPC ........ *H01L 23/5226* (2013.01); *H01L 23/528* (2013.01); *H01L 27/0207* (2013.01); *H01L 27/0924* (2013.01); *H01L 27/0928* (2013.01); *H10B 10/12* (2023.02)

(58) Field of Classification Search
  CPC ............. H01L 27/0928; H01L 27/1104; H01L 23/5226; H01L 23/528; G11C 11/412; G11C 11/419

USPC ....................................................... 257/369
  See application file for complete search history.

(56) References Cited

U.S. PATENT DOCUMENTS

| | | | |
|---|---|---|---|
| 9,768,179 | B1 | 9/2017 | Liaw |
| 10,096,520 | B2 | 10/2018 | Baek et al. |
| 11,695,011 | B2* | 7/2023 | Chong .................. H01L 27/098 257/272 |
| 2006/0050588 | A1 | 3/2006 | Osada et al. |
| 2008/0203437 | A1 | 8/2008 | Osada et al. |
| 2011/0221007 | A1 | 9/2011 | Nii |
| 2012/0106225 | A1 | 5/2012 | Deng et al. |
| 2013/0175631 | A1 | 7/2013 | Behrends et al. |
| 2015/0029773 | A1 | 1/2015 | Holla et al. |

OTHER PUBLICATIONS

Notice of Allowance issued in U.S. Appl. No. 16/502,790, dated Jun. 19, 2020.
Notice of Allowance issued in U.S. Appl. No. 17/080,617, dated Jan. 26, 2022.
Notice of Allowance issued in U.S. Appl. No. 17/751,426, dated Aug. 9, 2023.

* cited by examiner

LAYOUT OF STATIC RANDOM ACCESS MEMORY PERIPHERY CIRCUIT

PRIORITY CLAIM AND CROSS-REFERENCE

This application is a Continuation of U.S. patent application Ser. No. 17/751,426, filed May 23, 2022, now U.S. Pat. No. 11,856,747, which is a Continuation of U.S. patent application Ser. No. 17/080,617 filed Oct. 26, 2020, now U.S. Pat. No. 11,342,340, which is a Continuation of U.S. patent application Ser. No. 16/502,790 filed on Jul. 3, 2019, now U.S. Pat. No. 10,818,677, which claims priority to U.S. Provisional Application No. 62/698,702 filed on Jul. 16, 2018 and U.S. Provisional Application No. 62/715,529 filed on Aug. 7, 2018, the entire disclosure of each of these applications are incorporated herein by reference.

TECHNICAL FIELD

The present disclosure relates to a layout of a static random access memory (SRAM) cell.

BACKGROUND

As the semiconductor industry has progressed into nanometer technology process nodes in pursuit of higher device density, higher performance, lower power consumption and lower costs, new challenges from both fabrication and design issues have emerged. For example, as the size of the bitcells SRAM devices grows smaller (e.g., using an N5 node), the cell pitch may not be sufficient to place two source active regions using traditional SRAM layouts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Although in the present disclosure, circuit diagrams and layouts of a single static random access memory (SRAM) cell are explained, it should be appreciated that an SRAM generally includes a plurality of SRAM cells arranged in an array. In such an SRAM, word lines of the SRAM cells in the same row of the array may be connected to each other, bit lines of the SRAM cells in the same column of the array may be connected to each other, and power supply lines of the SRAM cells in the same row or the same column may be connected to each other.

Throughout the entire disclosure, specifying source active region or source region, and drain region is merely to distinguish two heavily doped regions disposed at opposite ends of a channel of a respective transistor. It should be appreciated that source active region or source region, and drain active region or drain region can be interchangeably used, respectively, without altering working principles of the present disclosure.

Figure 1:
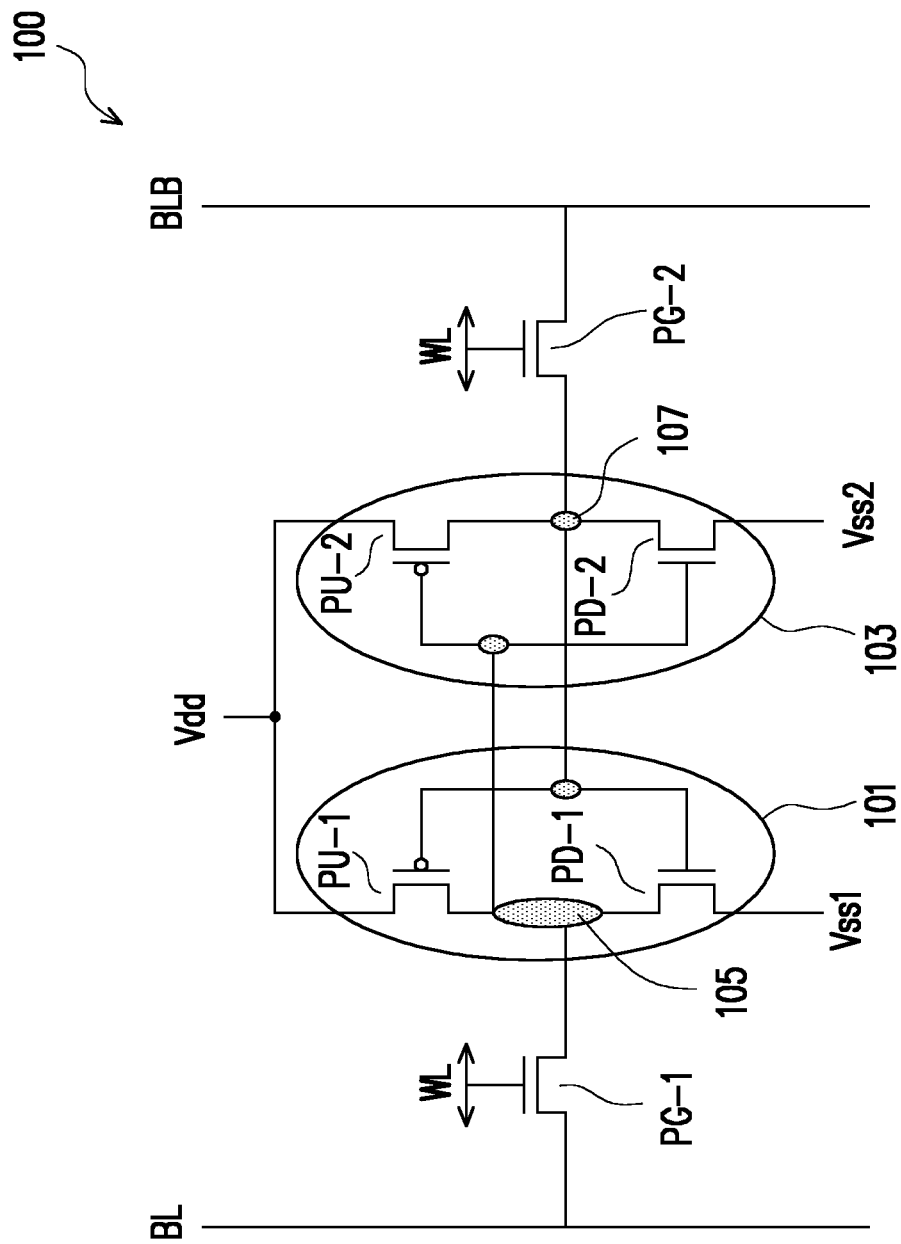
FIG. 1 is an exemplary circuit diagram of a SRAM high-density bitcell in accordance with some embodiments.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. A typical SRAM uses six MOSFETs to store each memory bit. FIG. 1 is a circuit diagram of a six transistor (6T) SRAM cell. The SRAM cell 100 includes a first inverter 101 formed by a pull-up p-type metal oxide semiconductor (PMOS) transistor PU-1 and a pull-down n-type metal oxide semiconductor (NMOS) transistor PD-1. The SRAM cell 100 further includes a second inverter 103 formed by a pull-up PMOS transistor PU-2 and a pull-down NMOS transistor PD-2. Furthermore, both the first inverter 101 and second inverter 103 are respectively coupled between a voltage bus Vdd and other potentials Vss1 and Vss2. In some examples, potentials Vss1 and Vss2 are a same ground potential.

As shown in FIG. 1, the first inverter 101 and the second inverter 103 are cross-coupled. That is, the first inverter 101 has an input connected to the output of the second inverter 103. Likewise, the second inverter 103 has an input connected to the output of the first inverter 101. The output of the first inverter is referred to as a storage node SN 105. Likewise, the output of the second inverter is referred to as a storage node SNB 107. In a normal operating mode, the storage node SN 105 is in the opposite logic state as the storage node SNB 107. By employing the two cross-coupled inverters, the SRAM cell 100 can hold the data using a latched structure so that the stored data will not be lost without applying a refresh cycle as long as power is supplied through Vdd.

In an SRAM array (not shown) using the 6T SRAM cells, the cells are arranged in rows and columns. The columns of the SRAM array are formed by a bit line pairs, namely a first bit line BL and a second bit line BLB. The cells of the SRAM array are disposed between the respective bit line pairs. As shown in FIG. 1, the SRAM cell 100 is placed between the bit line BL and the bit line BLB. In some embodiments, the SRAM array includes n-row and m-column matrix of SRAM cells, where n and m are natural number. In some embodiments, n and m are 4 or more. In certain embodiments, n and m are 64 or less, 128 or less, or 256 or less. At an end of each column, a peripheral circuit is disposed. In some embodiments, the width of the peripheral circuit for each column is equal to the width of the column (width of the SRAM cell).

As shown in FIG. 1, the SRAM cell 100 further includes a first pass-gate transistor PG-1 connected between the bit line BL and the output of the first inverter, the storage node SN (105). The SRAM cell 100 further includes a second pass-gate transistor PG-2 connected between the bit line BLB and the output of the second inverter, the storage node SNB (107). The gates of the first pass-gate transistor PG-1 and the second pass-gate transistor PG-2 are connected to a word line (WL), which connects SRAM cells in a row of the SRAM array.

In operation, if the pass-gate transistors PG-1 and PG-2 are inactive, the SRAM cell 100 will maintain the complementary values at storage nodes SN and SNB indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 100. For example, in an SRAM write operation, a logic state "1" stored in a data latch of the SRAM cell 100 can be reset by setting BL to "0" and BLB to "1". In response to a binary code from a row decoder (not shown), a word line coupled to the pass-gate transistors PG-1 and PG-2 of the SRAM cell 100 is asserted to select the memory cell and turn on PG-1 and PG-2. As a result, the storage nodes SN (105) and SNB (107) are connected to BL and BLB respectively. Furthermore, the storage node SN of the data latch is discharged by BL to "0" and the other storage node of the data latch is charged by BLB to "1". As a result, the new data logic "0" is latched into the SRAM cell 100.

In a READ operation, both BL and BLB of the SRAM cell 100 are pre-charged to a voltage approximately equal to the operating voltage of the memory bank in which the SRAM cell 100 is located. In response to a binary code from the row decoder, a word line coupled to the first pass-gate PG-1 and the second pass-gate PG-2 of the SRAM cell 100 is asserted so that the data latch is selected to proceed to a READ operation.

During a READ operation, through a turned on pass-gate transistors PG-1 and PG-2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

In the circuit diagram of FIG. 1, transistors PU-1, PU-2 are p-type transistors and transistors PD-1, PD-2, PG-1, and PG-2 are n-type transistors. According to some embodiments, transistors PU-1, PU-2, PD-1, PD-2, PG-1 and PG-2 are implemented as FinFETs.

Figures 2A, 2B:
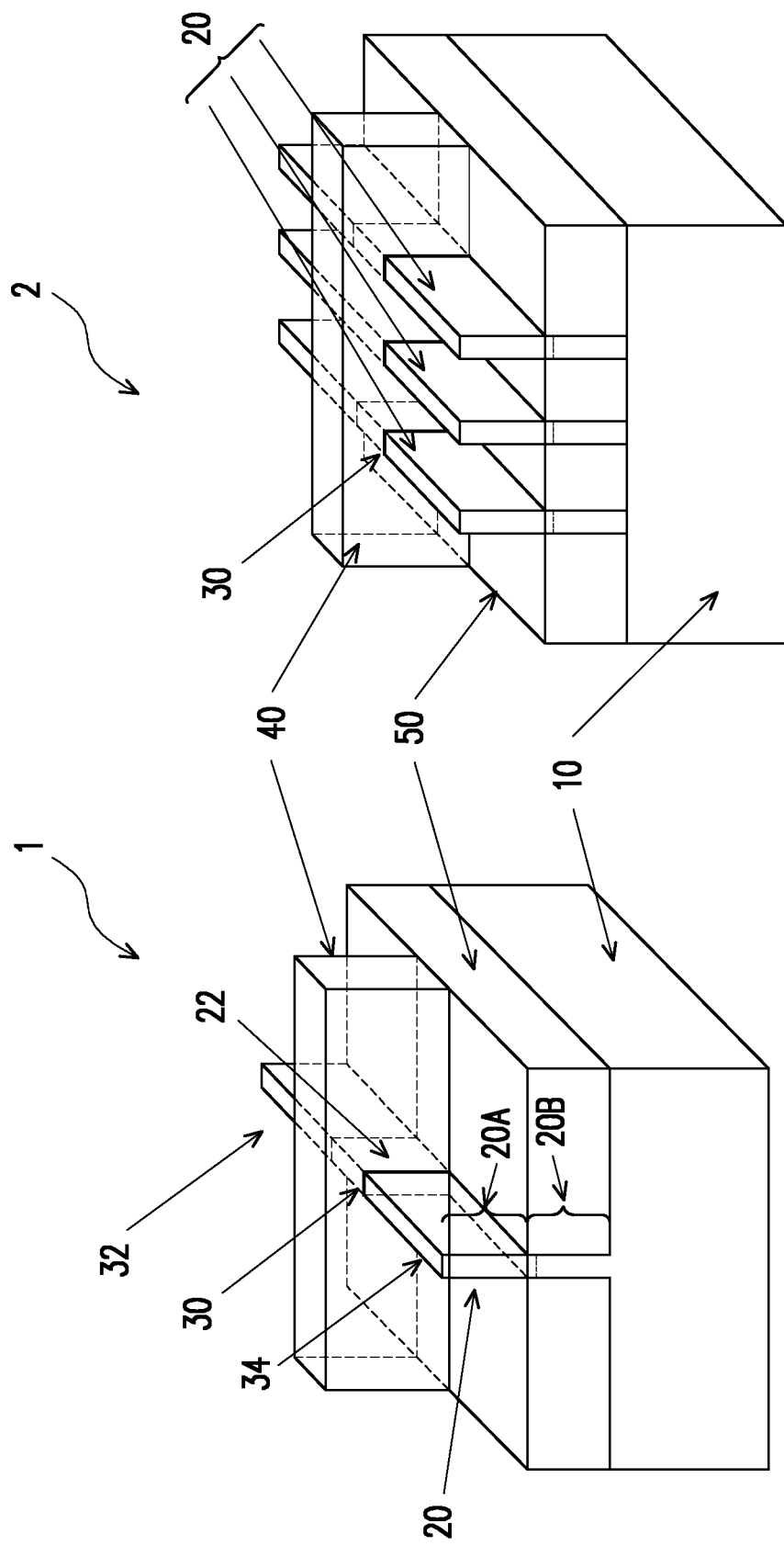
FIG. 2A illustrates in perspective view a FinFET transistor in accordance with an embodiment.
FIG. 2B illustrates in perspective view a FinFET transistor in accordance with an embodiment.

FIG. 2A shows an exemplary perspective view of a fin field-effect transistor 1 (FinFET 1), which can be employed to implement the SRAM cell shown in FIG. 1. The FinFET 1 includes, among other features, a substrate 10, a fin structure 20, a gate dielectric 30 and a gate electrode 40. In some embodiment, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The fin structure 20 is disposed over the substrate. The fin structure 20 may be made of the same material as the substrate 10 and may protrude from the substrate 10. In some embodiment, the fin structure is made of Si. In some examples, substrate 10 is a silicon-on-insulator (SOI) substrate. The fin structure 20 may be intrinsic and then may appropriately be doped with an n-type impurity or a p-type impurity. In some embodiments, source and drain regions 32 and 34 are heavily doped and may contain impurities having a concentration in a range from about $5 \times 10^{19}$ cm$^{-3}$ to $1 \times 10^{20}$ cm$^{-3}$, while channel region 22 is unhoped or lightly doped.

A height of fin structure 20 includes an upper part 20A and a lower part 20B embedded in the isolation insulating layer 50, and the upper part 20A of the fin structure 20 protrudes from the isolation insulating layer 50. A middle portion of the upper part 20A, along a length of the upper part 20A under the gate electrode 40, is a channel region 22 and the two end portions of the upper part 20A are source and drain regions 32 and 34. In some examples, two or more fin structures 20 having two or more channels are formed on substrate 10. A FinFET having two or more channels is described with respect to FIG. 2B. Spaces between the fin structures 20 and/or a space between one fin structure and another element formed over the substrate 10 are filled by an isolation insulating layer 50. In some embodiments, the isolation insulating layer 50 is a "shallow-trench-isolation (STI)" layer filled with an insulating material. The insulating material for the insulating layer 50 includes silicon oxide, silicon nitride, silicon oxynitride (SiON), SiOCN, fluorine-doped silicate glass (FSG), or a low-k dielectric material or other suitable material.

The channel region 22 of upper part 20A protruding from the isolation insulating layer 50 is covered by a gate dielectric layer 30, and the gate dielectric layer 30 is further covered by a gate electrode 40. Portions of upper part 20A not covered by the gate electrode 40, e.g., regions 32 and 34, function as source and drain of the MOSFET.

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 may be made of one or more layers of suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, or other suitable materials, and/or combinations thereof. In some embodiments, gate electrode layer 40 is formed over the channel region 22, and extends to cover sidewalls of the channel region 22 and to cover portions of the insulating layer 50.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of a combination of two or more of these materials. For an n-type channel FinFET (the n-channel FinFET), one or more of TaN, TaAlC, TiN, TiC, Co, TiAl, HfTi, TiSi and TaSi, or any other suitable materials, is used as the work function adjustment layer, and for the p-channel FinFET, one or more of TiAlC, Al, TiAl, TaN, TaAlC, TiN, TiC and Co, or any other suitable materials, is used as the work function adjustment layer. The work function adjustment layer may be formed separately for the n-channel FinFET and a p-type channel FinFET (the p-channel FinFET), because p-channels may use different metal layers.

Source and drain regions 32 and 34 that are also formed in the fin structure 20 may appropriately be doped with impurities. In some examples, source and drain regions are not part of the fin structure 20 but are epitaxially grown at the two ends of the fin structure 20 using appropriate material. An alloy of Si or Ge and a metal such as Co, Ni, W, Ti or Ta, or any other suitable material may be formed on the source and drain regions to create source and drain contacts.

FIG. 2B illustrates in perspective view of a FinFET 2 in accordance with some embodiment. The FinFET 2 includes, among other features, substrate 10, two or more, e.g., three fin structures 20, gate dielectric 30 and gate electrode 40 similar to FinFET 1 of FIG. 2A. The fin structures 20 may protrude from the isolation insulating layer 50. In some examples, as shown in FIG. 2B, a single gate dielectric 30 and a single gate electrode 40 cover all three fin structures 20. Thus, although having three fin structures 20 (3 fins), FinFET 2 forms one transistor having a higher current driving capability than FinFET 1 shown in FIG. 2A. In some embodiments, the FinFET 2 is referred to a 3×1 (three fin and one gate) transistor. Similarly, FinFET 1 of FIG. 2A is referred to a 1×1 (one fin and one gate) transistor.

In some embodiments, the configuration of the FinFET 1 or the configuration of FinFET 2 are used as an N-type transistor to implement, for example, the pass-gate transistors PG-1 and PG-2 and the pull-down transistors PD-1 and PD-2 in the SRAM cell 100. In some embodiments, the configuration of the FinFET 1 or the configuration of FinFET 2 is used as a P-type transistor to implement, for example, the pull-up transistors PU-1 and PU-2 in the SRAM cell 100. The materials for forming the gate electrode layers or thicknesses of corresponding portions of the gate electrode layers of the N-type transistors and the P-type transistors may be different, so as to obtain suitable work function levels for the N-type transistors and the P-type transistors, respectively.

Figure 3:
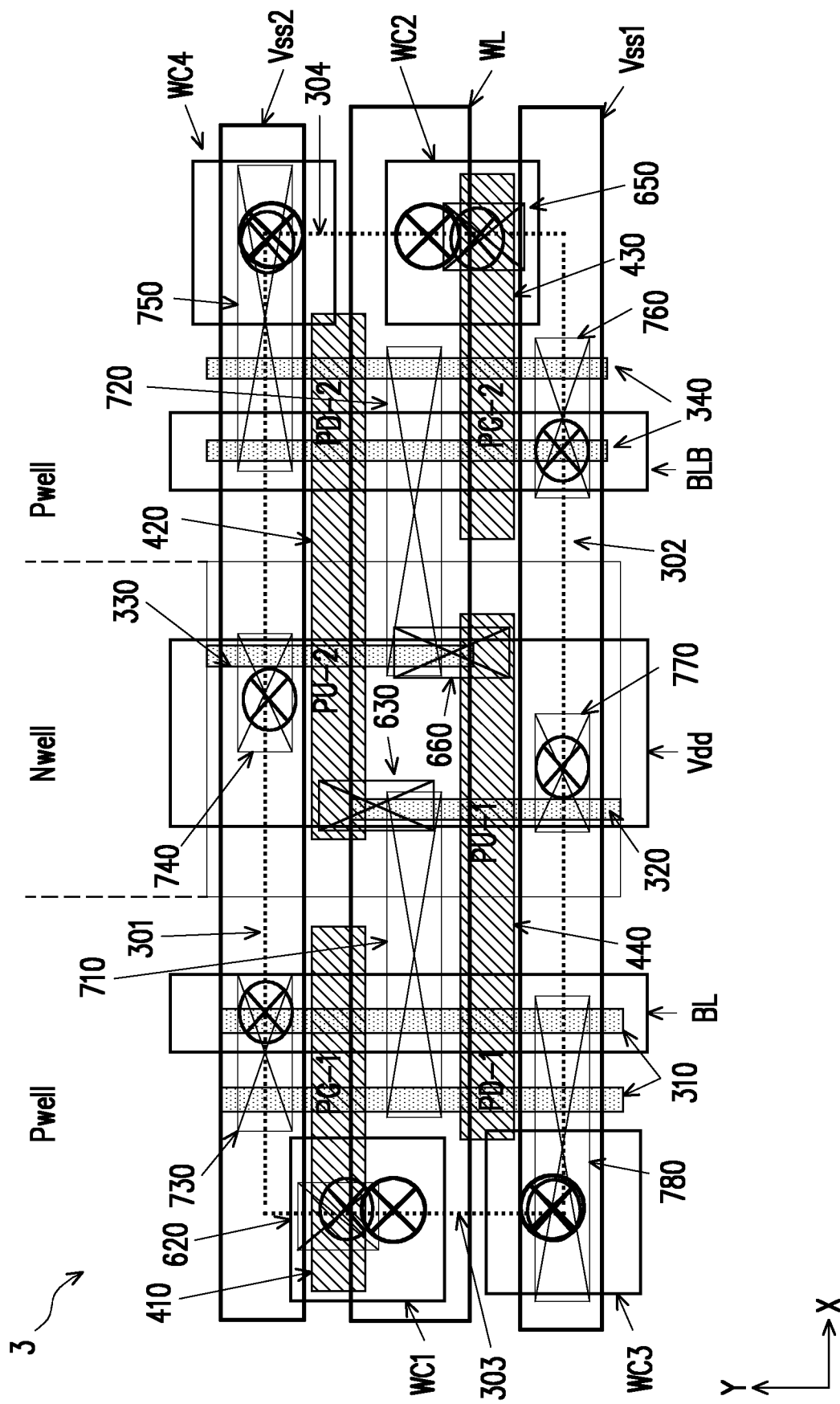
FIG. 3 is an exemplary simplified layout of an SRAM cell of which the circuit diagram is shown in FIG. 1.

FIG. 3 illustrates an exemplary simplified layout of the SRAM cell 3, of which the circuit diagram is shown in FIG. 1. For convenience of illustration, an exemplary simplified layout shown in FIG. 3 only illustrates a layout of wells, semiconductor fins, gate electrode layers/gate electrodes, contacts formed on semiconductor fins, gate contacts formed on the gate electrode layers/gate electrodes, vias (via0 and vias1), a first metal layer M1, and a second metal layer M2. One of ordinary skill in the art should understand that one or more metal layers can be formed at a level above the second metal layer M2 and be electrically connected to conductive patterns therebelow through vias therebetween.

Referring to FIG. 3, the SRAM cell 3 is formed in a region defined by first and second boundaries 301 and 302 parallel to the X axis and third and fourth boundaries 303 and 304 parallel to the Y axis and connected between the first and second boundaries 301 and 302. In other words, the region (a unit cell) has a rectangular shape enclosed by the boundaries 301-304. The region defined by the first through fourth boundaries 301 through 304 includes three wells, which are an N-type well, Nwell, located at a center thereof and first and second P-type wells, Pwells, located on opposite sides of the Nwell.

In FIG. 3, only the boundaries of the Nwell are marked. One having ordinary skill in the art should understand that the first and second Pwells occupy the remaining portions of the SRAM cell 3.

In some embodiments, in a case in which a layer crosses one of boundaries of a cell or extends from one boundary to another boundary, the layer is symmetrically arranged with reference to the one boundary. In this FIG. 3 case, in an SRAM cell and another SRAM cell adjacent to the SRAM cell sharing the same boundary with the SRAM cell, a layer which crosses the same boundary is continuously formed such that portions of the layer located in the two SRAM cells constitute an integral continuous layer. For example, as shown in FIG. 3, first semiconductor fins 310 each extends continuously between the first and second boundaries 301 and 302 and can further extend continuously to another SRAM cell (not shown) adjacent to the SRAM cell 3 in the Y axis. On the other hand, in a case in which a layer is spaced apart from one of boundaries of a cell, the layer is discontinuously formed in two immediately adjacent cells. In this FIG. 3 case, in an SRAM cell and another SRAM cell adjacent to the SRAM cell sharing the same boundary with the SRAM cell, the second gate electrode layer 420 is spaced apart from the fourth boundary 304 and is not directly coupled to a corresponding second gate electrode layer 420 formed in the other SRAM cell immediately adjacent thereto. In this case, the second gate electrode layers 420 of two immediately adjacent cells are spaced apart from each other.

As shown in FIG. 3, the SRAM cell 3 includes the first semiconductor fins 310, a second semiconductor fin 320, a third semiconductor fin 330, and fourth semiconductor fins 340 each extending along Y direction and sequentially arranged along the X axis. One or more fin field-effect transistors (fin FET) can be constructed based on the semiconductor fins as shown in FIGS. 2A and 2B.

Referring back to FIG. 3, the first and fourth semiconductor fins 310 and 340 each extend continuously between the first and second boundaries 301 and 302, and are respectively formed in the first and second Pwells located on opposite sides of the Nwell. The second semiconductor fin 320, formed within the Nwell, extends from the second boundary 302 toward the first boundary 301 but is spaced apart from the first boundary 301. The third semiconductor fin 330, formed within the Nwell, extends from the first boundary 301 toward the second boundary 302 but is spaced apart from the second boundary 302.

Source, drain, and channel regions of the first pass-gate transistor PG-1 and the first pull-down transistor PD-1 of the SRAM cell 3 are made of the first semiconductor fins 310. Source, drain, and channel regions of the second pass-gate transistor PG-2 and the second pull-down transistor PD-2 are made of the fourth semiconductor fins 340. Source, drain, and channel regions of the first pull-up transistor PU-1 of the SRAM cell 3 and source, drain, and channel regions of the second pull-up transistor PU-2 of the SRAM cell 3 are made of the second and third semiconductor fins 320 and 330, respectively.

As shown in FIG. 3, the first semiconductor fins 310 and the fourth semiconductor fins 340 each include two parallel semiconductor fins to provide a larger driving current. Thus, in some embodiments, each of the first pass-gate transistor PG-1, the first pull-down transistor PD-1, the second pull-down transistor PD-2, and the second pass-gate transistor PG-2 are formed of a two semiconductor fins. In such a case, a higher current driving capacity is realized. In some other embodiments, each of the first pass-gate transistor PG-1, the first pull-down transistor PD-1, the second pull-down transistor PD-2, and the second pass-gate transistor PG-2 are formed of a single semiconductor fin. In such a case, a smaller size SRAM bitcell is realized. In yet some other embodiments, each of the first pass-gate transistor PG-1, the first pull-down transistor PD-1, the second pull-down transistor PD-2, and the second pass-gate transistor PG-2 are formed of more than two semiconductor fins such that more than two parallel connected sub-transistors, in which source, drain, and channel regions are arranged parallel to each other have a common gate electrode that is formed over the more than two parallel channel regions of the more than two semiconductor fins.

As show in FIG. 3, the SRAM cell 3 includes first and second gate electrode layers 410 and 420 spaced-apart from each other and aligned in the X axis. The first gate electrode layer 410 is formed over the channel region of the first pass-gate transistor PG-1, and the second gate electrode layer 420 is formed over the channel regions of the second pull-up transistor PU-2 and the second pull-down transistor PD-2. The SRAM cell 3 also includes a third gate electrode layer 430 covering the channel region of the second pass-gate transistor PG-2 and a fourth gate electrode layer 440 covering the channel regions of the first pull-up transistor PU-1 and the first pull-down transistor PD-1. The third gate electrode layer 430 and the fourth gate electrode layer 440 are spaced-apart from each other and aligned to each other in the X axis.

The first pass-gate transistor PG-1 and the first pull-down transistor PD-1 of the SRAM cell 3 have the drain regions thereof directly coupled to each other by a central portion of the first semiconductor fins 310. The drain region of the first pull-up transistor PU-1 is connected to the coupled drain regions of the first pass-gate transistor PG-1 and the first pull-down transistor PD-1 through a longer contact 710. The second pass-gate transistor PG-2 and the second pull-down transistor PD-2 of the SRAM cell 3 have the drain regions thereof directly coupled to each other by a central portion of the fourth semiconductor fins 340. The drain region of the second pull-up transistor PU-2 is connected to the coupled drain regions of the second pass-gate transistor PG-2 and the second pull-down transistor PD-2 through a longer contact 720. A longer contact having a rectangular shape in the layout view may have a thickness greater than a gate contact (e.g., gate contact 408 in FIG. 4), such that the longer contact can connect source or drain region or a silicide layer over the source or drain region to via0 or can be electrically connected to a gate electrode layer through a gate contact formed thereon.

The longer contacts 710 and 720 are respectively electrically connected to the second and fourth gate electrode layers 420 and 440 through butt contacts 630 and 660 formed thereon. Thus, the drain regions of the first pass-gate transistor PG-1, the first pull-down transistor PD-1, and the first pull-up transistor PU-1, and the second gate electrode layer 420 covering channels of the second pull-up transistor PU-2 and the second pull-down transistor PD-2 are electrically connected by the longer contact 710 and the butt contact 630. The longer contact 710 and the butt contact 630 act as the storage node SN 105 shown in FIG. 1. The drain regions of the second pass-gate transistor PG-2, the second pull-down transistor PD-2, and the second pull-up transistor PU-2, and the fourth gate electrode layer 440 covering channels of the first pull-up transistor PU-1 and the first pull-down transistor PD-1 are electrically connected by the longer contact 720 and the butt contact 660. The longer contact 720 and the butt contact 660 act as the storage node SNB 107 shown in FIG. 1.

The SRAM cell 3 further includes additional longer contacts including longer contacts 730, 740, 750, 760, 770, and 780. The longer contact 730 electrically contacts a portion of the first semiconductor fins 310 which forms the source region of the first pass-gate transistor PG-1, such that the source region of the first pass-gate transistor PG-1 can be electrically connected to the first bit line BL through the longer contact 730 and a via via0 formed thereon. The longer contact 740 electrically contacts a portion of the third semiconductor fin 330 which forms the source region of the second pull-up transistor PU-2, such that the source region of the second pull-up transistor PU-2 can be electrically connected to the power line Vdd through the longer contact 740 and a via via0 formed thereon. The longer contact 750 electrically contacts a portion of the fourth semiconductor fins 340 which forms the source region of the second pull-down transistor PD-2. The longer contact 760 electrically contacts a portion of the fourth semiconductor fins 340 which forms the source region of the second pass-gate transistor PG-2, such that the source region of the second pass-gate transistor PG-2 can be electrically connected to the second bit line BLB through the longer contact 760 and a via via0 formed thereon. The longer contact 770 electrically contact a portion of the second semiconductor fin 320 which forms the source region of the first pull-up transistor PU-1, such that the source region of the first pull-up transistor PU-1 can be electrically connected to the power line Vdd through the longer contact 770 and a via via0 formed thereon. The longer contact 780 electrically contacts a portion of the first semiconductor fins 310 which forms the source region of the first pull-down transistor PD-1.

The longer contacts 730, 740, and 750 are aligned to each other along the X axis and disposed over the first boundary 301, the longer contacts 760, 770, and 780 are aligned to each other along the X axis and disposed over the second boundary 302, and the longer contacts 710 and 720 are aligned to each other in the X axis and disposed in an intermediate region of the SRAM cell 3. The first and second gate electrode layers 410 and 420 are aligned to each other in the X axis and disposed in a region between the longer contacts 730, 740, and 750, and the longer contacts 710 and 720. The third and fourth gate electrode layers 430 and 440 are aligned to each other in the X axis and disposed in a region between the longer contacts 760, 770, and 780, and the longer contacts 710 and 720. That is, patterns of the gate electrode layers and patterns of the longer contacts are alternately arranged in the Y axis.

As shown in FIG. 3, a first metal layer M1, which forms the power line Vdd, form the first and second bit lines BL and BLB. The first metal line M1 can additionally form first and second word line contacts WC1 and WC2 which are respectfully electrically connected to the first and third gate electrode layers 410 and 430 through vias via0 formed thereon. The first metal layer M1 may additionally form third and fourth word line contacts WC3 and WC4 which are respectfully electrically connected to the longer contacts 780 and 750 through vias via0 formed thereon. The word line contacts WC1 and WC2 can be electrically connected, through vias via1 above vias via0, to a word line WL formed in a second metal layer M2 above the first metal layer M1.

The second metal layer M2 also includes the first and second power lines Vss1 and Vss2 extending parallel to the word line WL. The first power line Vss1 is electrically connected to the longer contact 780 through a via via1 therebetween, such that the source region of the first pull-down transistor PD-1 can be electrically connected to the first power line Vss1. The second power line Vss2 is electrically connected to the longer contact 750 through a via via1 therebetween, such that the source region of the second pull-down transistor PD-2 can be electrically connected to the second power line Vss2.

Figure 4:
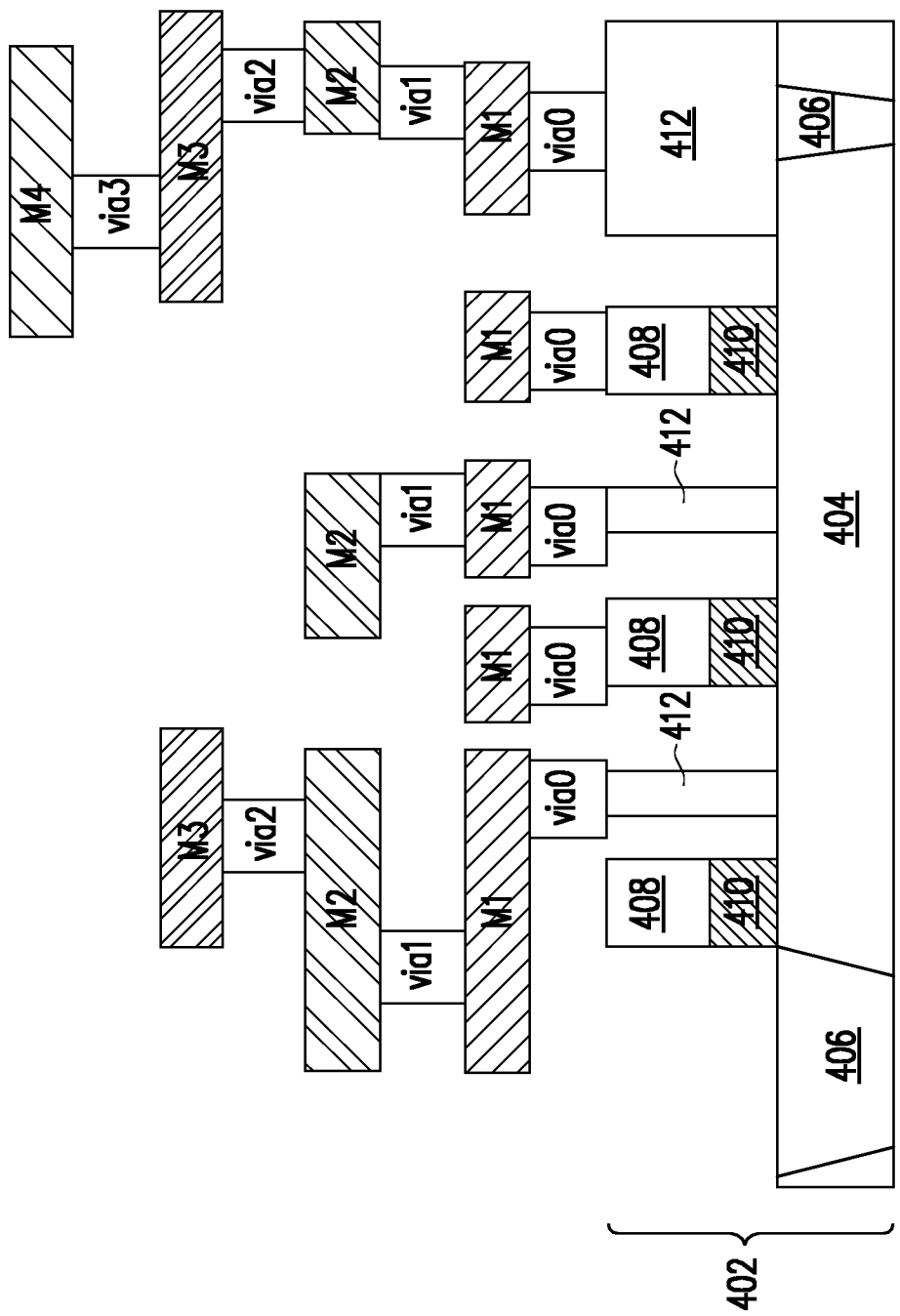
FIG. 4 shows an exemplary vertical configuration of an SRAM device.

FIG. 4 shows an exemplary vertical configuration of an SRAM device. The SRAM device may include a plurality of SRAM cells such as the aforementioned SRAM cell 3. The SRAM device may include core structure 402, a first metal layer M1, and one or more upper metal layers M2, M3, and M4 in respective order on top of the M1. The SRAM device may include vias including vias via0 and via1 and additional vias such as via2 and via3 depending on whether one or more upper metal layers M3 and M4 are used to implement the SRAM device. The core structure 402 may include one or more STI 406, semiconductor material 404 that include one or more semiconductor fins, gate electrode layers 410 over the semiconductor fins, gate contacts 408, and source/drain contacts 412. In some embodiments, the vias and metal layers are made of, but not limited to, one or more layers of Cu, W, Al, AlCu, TiN, TiW, Ti, Co, Ni, TaN, Ta, a combination thereof, or other suitable material.

Figure 5:
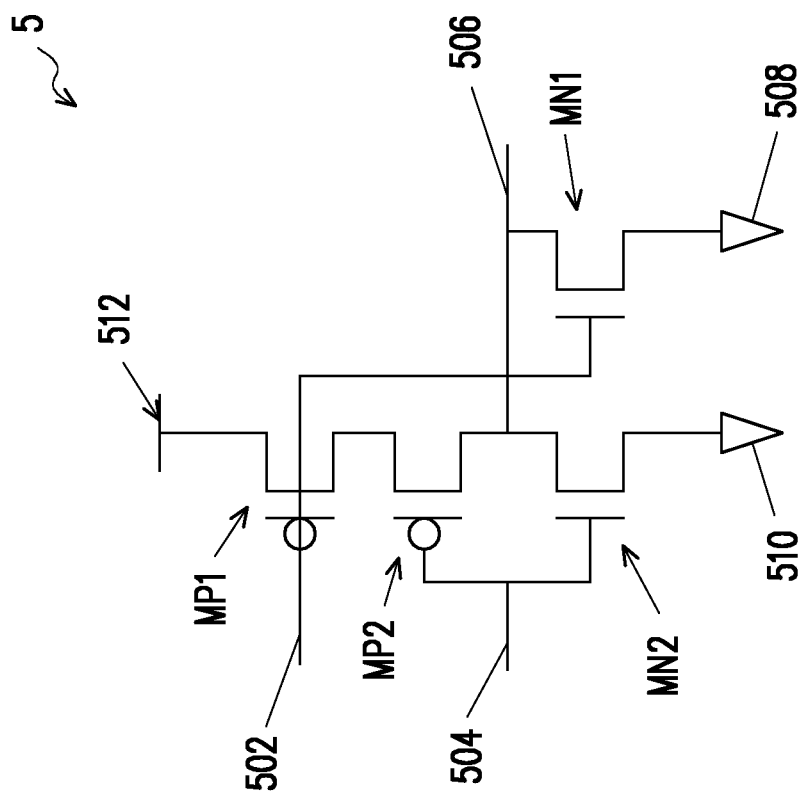
FIG. 5 is an exemplary circuit diagram of a SRAM periphery circuit according to some embodiments.
Figure 6A:
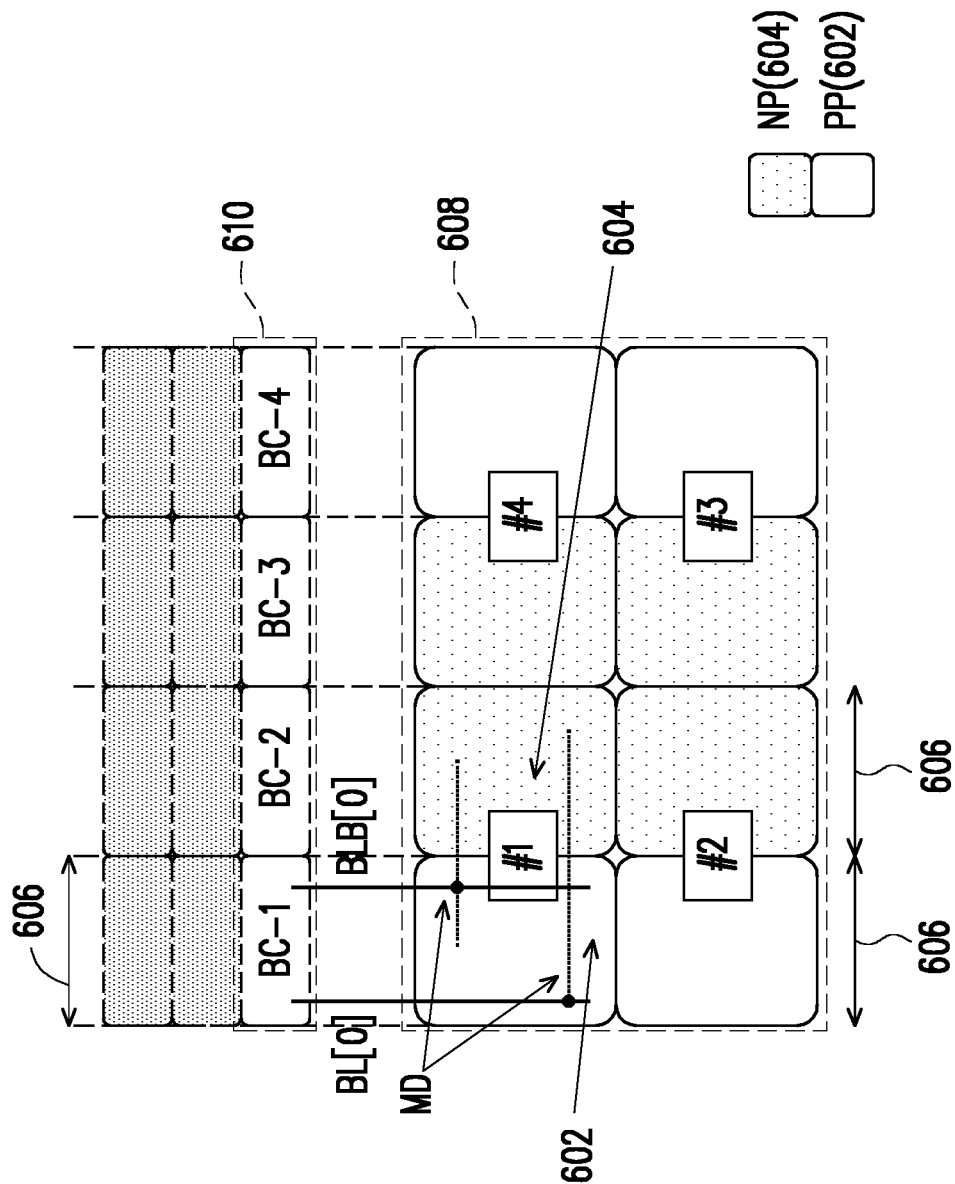
FIG. 6A schematically illustrates the arrangement of memory cell (bitcell) regions, bit lines, and four SRAM periphery circuits according to some embodiments.
Figure 6B:
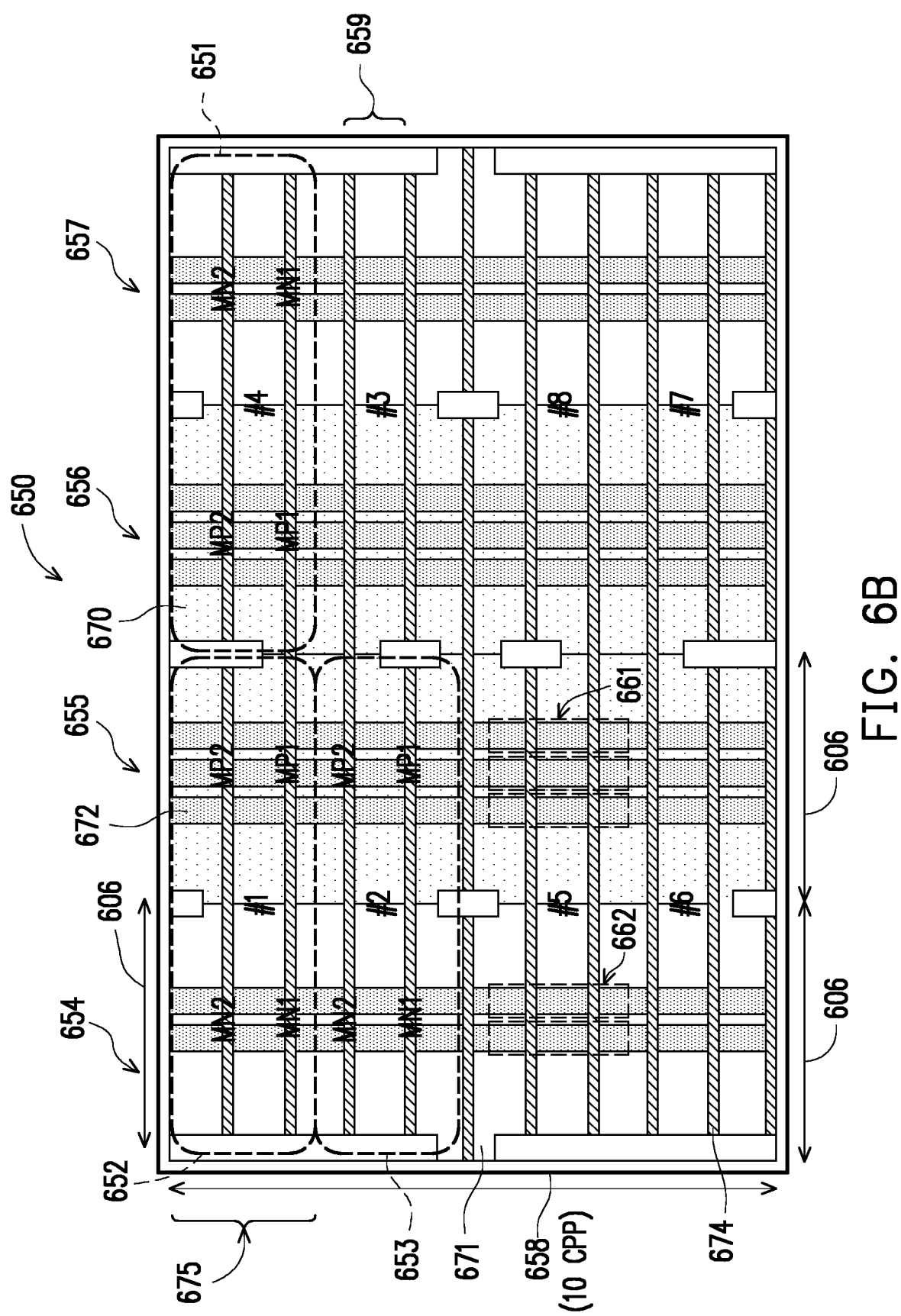
FIG. 6B illustrates an arrangement of the layout of the eight SRAM periphery circuits according to some embodiments.
Figure 6C:
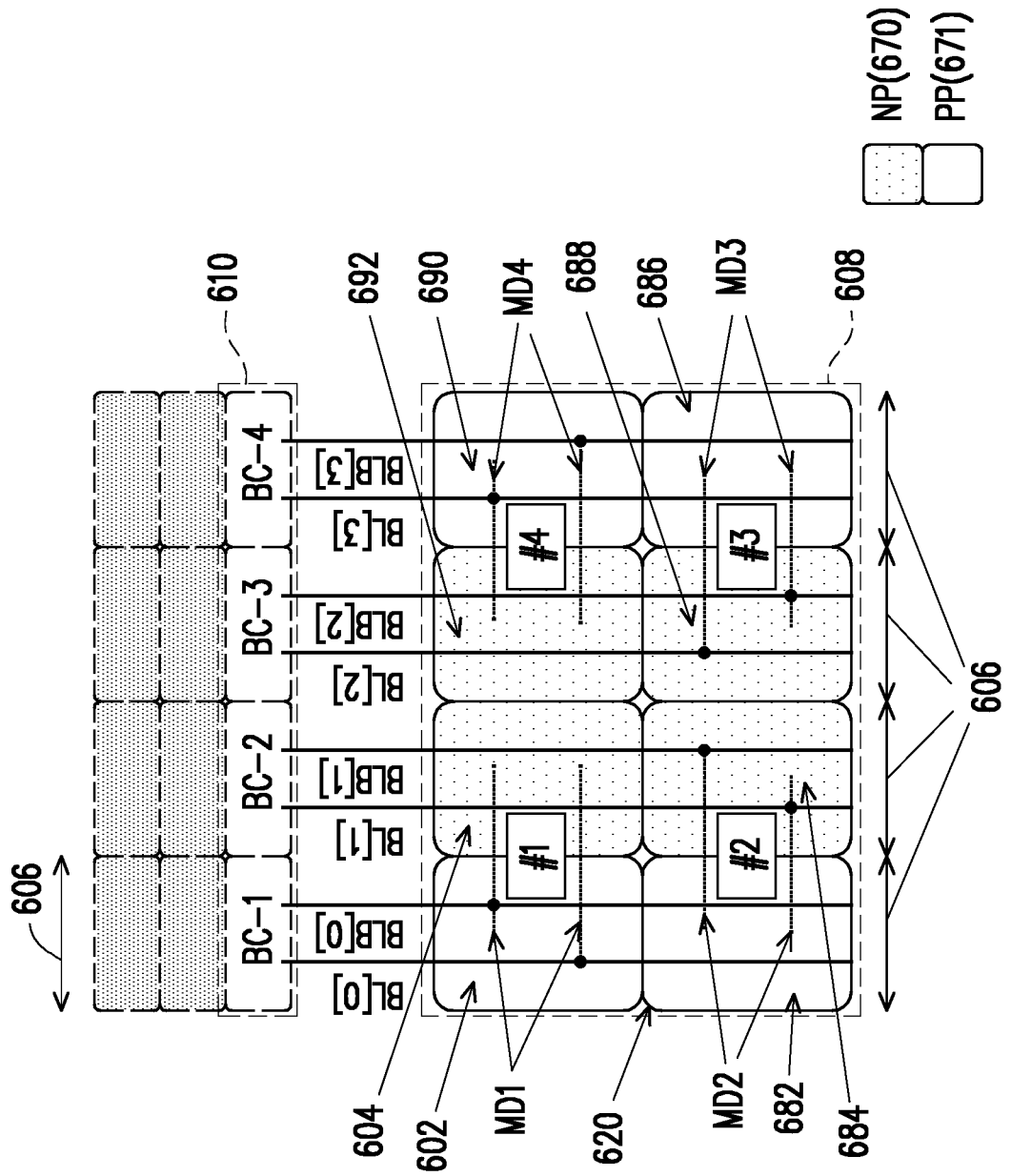
FIG. 6C schematically illustrates the arrangement of bitcell regions, bit lines, and four SRAM periphery circuits according to some embodiments.

The SRAM periphery circuit 5 shown in the FIG. 5 depicts a two-input NOR gate which can be a portion of a bit line decoder circuit. Inputs 502 and 504 of the SRAM periphery circuit 5 connect to bit lines BL and BLB of an SRAM bitcell, e.g., SRAM cell 3 of FIG. 3 or the SRAM cell 100 of FIG. 1, through at least one of the metal layers M1, M2, M3, or M4 of FIG. 4. The SRAM periphery circuit 5 may be used during a READ operation as part of a bit line decoder circuit for decoding, e.g., detecting, a content of the SRAM cell 3 or the SRAM cell 100. The NOR gate includes two p-type transistors MP1 and MP2, and two n-type transistors MN1 and MN2. In some embodiments, the transistors MP1, MP2, MN1 and MN2 are FinFETs shown in FIG. 2A or 2B. In some embodiments, the p-type transistor MP1 and the n-type transistor MN1 of FIG. 5 have two fins and one gate and thus MP1 and MN1 are 2×1 transistors. Also, the p-type transistor MP2 and the n-type transistor MN2 have two fins and two gates and thus MP2 and MN2 are 2×2 transistors. In other embodiments, MN1 and MN2 are 3×1 transistors and MP1 and MP2 are 4×1 transistors. In some embodiments, when fabricating an SRAM device, in the interest of space efficiency and for the purpose of compliance with design rules, it might be desirable that the pitch of the periphery circuit 5 matches with the pitch of the SRAM bitcell. The pitch of the SRAM periphery circuit 5 is the pitch in the row direction that includes the periphery circuit 5, including the transistors MP1, MP2, MN1 and MN2. The pitch of the SRAM bitcell is shown by bitcell-pitch 606 in FIGS. 6A-C, is the pitch in the row direction (x-direction) that includes the SRAM cell 3 of FIG. 3. In some embodiments, the SRAM periphery circuit 5 includes an output 506. Connection 512 of periphery circuit 5 may be coupled to voltage bus Vdd and connections 508 and 510 may be coupled to other potentials Vss1 and Vss2, that either Vss1 or Vss2 or both may be the ground.

As described, the SRAM periphery circuit 5 includes two n-type transistors MN1 and MN2 and two p-type transistors MP1 and MP2. In some embodiments, the two n-type transistors MN1 and MN2 are disposed in a p-active well region. In addition, the two p-type transistors MP1 and MP2 are disposed in an n-active well region. The layout of the SRAM periphery circuit 5 is described below with respect to FIG. 6B. In some embodiments, the p-active well regions and the n-active well regions of a plurality of the SRAM periphery circuits 5 may be disposed alternately adjacent to each other in a row direction. As used herein, the term a p-active well region refers to a well region that is doped with a p-type dopant, and an n-active well region refers to a well region that is doped with an n-type dopant. Source/drain active regions and the fins are formed over the well regions. In some embodiments, when a source/drain active region and a fin for a p-type FinFET are formed over an n-active well region, the well region is referred to as an NP well, or simply NP. In some embodiments, when a source/drain active region and a fin for an n-type FinFET are formed over a p-active well region, the well region is referred to as a PP well, or simply PP.

In some embodiments that the pitch of the periphery circuit 5 matches with the pitch of the SRAM bitcell, two horizontally adjacent active well regions (e.g., two wells), one NP well for the p-type transistors and one PP well for the n-type transistors are disposed in one bitcell-pitch 606 (not shown).

When the periphery circuit 5, with MP2 and MN2 being 2×2 and MP1 and MN1 being 2×1, is implemented within one SRAM bitcell-pitch, there may not be sufficient width for implementing two adjacent NP well and PP well in one bitcell-pitch and the implementation may violate the minimum spacing of the design rule. Thus, the implementation of periphery circuit 5 in one bitcell pitch may violate the design rule check (DRC) and at least one of the wells may "spill over" the width of the bitcell-pitch.

One potential remedy for this violation of design rule check (DRC) is the use a first design rule for the SRAM cell 3 of FIG. 3 and a different second design rule to implement the periphery circuit 5 layout. However, using two separate design rules limits the types of FinFET devices that can be used in the layout. Moreover, there would be an excessive cost to mix the two design rules because an extra transition rule may be required to be implemented in a transition region between the regions having different design rules.

FIG. 6A schematically illustrates the arrangement of regions of four bitcells, bit lines, and four SRAM periphery circuits 5 of FIG. 5 according to some embodiments. FIG. 6A shows four bitcells, bitcell number 1 (BC-1), bitcell number 2 (BC-2), bitcell number 3 (BC-3), and bitcell number 4 (BC-4) in a bitcell array 610, which each bitcell is consistent with bitcell 3 of FIG. 3. FIG. 6A also shows four SRAM periphery circuits, periphery circuit number 1 (#1) to periphery circuit number 4 (#4) in a periphery circuit array 608, which each periphery circuit is consistent with periphery circuit 5 of FIG. 5. As shown in FIG. 6A, each bitcell extends one pitch, the bitcell pitch 606, however, each periphery circuit 5 extends two adjacent bitcell pitches 606 along the row direction. In some embodiments, one of the bitcell pitches 606 of periphery circuit 5 is of NP well type and the other bitcell pitch 606 of the same periphery circuit 5 is of PP well type. FIG. 6A also shows bit lines BL and BLB of the bitcell number 1, BL[0] and BLB [0], extending from bitcell number 1 (BC-1) to periphery circuit number 1 (#1). As shown in FIG. 6A, periphery circuit number 1 is arranged in two adjacent wells, in PP well 602 and in NP well 604 where each one of the well cells 602 and 604 extends one bitcell-pitch 606 in the row direction. In some embodiments, the two p-type transistors MP1 and MP2 are implemented in NP well 604 and the two n-type transistors MN1 and MN2 are implemented in PP well 602. The layout is described in more details in FIG. 6B.

In some embodiments, each one of the four SRAM periphery circuits of FIG. 6A, is associated with one of the four bitcells, bitcell number 1 to bitcell number 4. For example, periphery circuit number 1 (#1) is associated with bitcell number 1 (BC-1), periphery circuit number 2 (#2) is associated with bitcell number 2 (BC-2), periphery circuit number 3 (#3) is associated with bitcell number 3 (BC-3), and periphery circuit number 4 (#4) is associated with bitcell number 4 (BC-4). The connections from the bit lines BL and BLB of the bitcells to periphery circuits are described in more details with respect to FIG. 6C. The correspondence between the bitcell numbers and the periphery circuit numbers is not limited to the above example. In other embodiments, the periphery circuit number 2 (#2) is associated with bitcell number 1 (BC-1) and the periphery circuit number 1 (#1) is associated with bitcell number 2 (BC-2), and/or the periphery circuit number 4 (#4) is associated with bitcell number 3 (BC-3), and the periphery circuit number 3 (#3) is associated with bitcell number 4 (BC-4).

In some embodiments, two n-type active regions NP are disposed adjacent to each other in the row direction, and a p-type active region PP is disposed on each side of the two NP regions as shown in FIG. 6A. As shown, the layout for each periphery circuit spans the two bitcell pitches that are placed adjacent to each other in the row direction. As shown, FIG. 6A has NP and PP wells in two separate pitches (columns) and the layout avoids on column having two wells (1-column-2-well). Thus, inside each pitch (column), a single type of well (NP or PP) exists and the implantation spacing cost to put extra space between different types of well in a pitch (column) does not incur. Additionally, in the vertical direction, the PP and NP wells are arranged in separate columns, avoiding spacing cost between different types of well in the vertical direction.

As can be seen in FIG. 6A, the bit lines BL[0] and BLB[0] does not directly pass through both PP well 602 and NP well 604 of periphery circuit #1. For example, as can be seen in the layout of FIG. 6A, bit lines BL[0] and BLB[0] although pass through PP well 602 and gets connected to elements of PP well 602, but do not pass through NP well 604. The connections to corresponding transistors in such a layout are, therefore, achieved by disposing connection lines MD of FIG. 6A in a metallization layer, e.g., at least one of the metallization layers M1, M2, M3, or M4 of FIG. 4, over the PP and NP wells and connecting the corresponding elements of NP well 604, via the connection lines MD, to the corresponding bit lines BL[0] and BLB [0]. In other embodiments, the connection lines MD are formed by directly disposing a local interconnect layer between the gate contacts 408 and/or the source/drain contacts 412 of FIG. 4 and the bit lines BL[0] and BLB [0]. The local interconnect layer is one or more connection lines disposed below the first metal layer M1 and connects elements having a relatively short distance, e.g., elements that are within one or two bitcell-pitch distance. The local interconnect layer is described, for example, in U.S. Pat. No. 9,881,872, the entirety of which is incorporated herein by reference. In some embodiments, the connection lines MD and bit lines BL[0] and BLB [0] may not be in a same metallization layer and thus a connection between connection lines MD and bit lines BL[0] and BLB[0] may be provided through vias.

FIG. 6B illustrates an arrangement a layout 650 of eight SRAM periphery circuits 5 of FIG. 5 when implemented according to some embodiments. The layout 650 shows a layer with eight periphery circuits, periphery circuits number 1 (#1) to number 8 (#8) where each one the periphery circuits #1 to #8 are consistent with periphery circuit 5 of FIG. 5. In some embodiments, the periphery circuits of FIG. 6B may have more fins and less gates compared to the periphery circuit 5 discussed above. In some embodiments, MP2 is a 4×1 transistor, having four fins and one gate, MP1 is a 4×1 transistor, MN2 is a 3×1 transistor, having three fins and one gate, and MN1 is a 3×1 transistor. The layout of periphery circuit #1, which is consistent with periphery circuit 5 is shown inside a boundary 652 of layout 650. The two n-type transistors MN1 and MN2 and the two p-type transistors MP1 and MP2 of the periphery circuit #1 are shown inside the boundary 652, with MP2 being 3×1, MP1 being 3×1, MN2 being 2×1, and MN2 being 2×1. As shown, boundary 652 of periphery circuit 5 occupies, e.g., spans, two columns or two bitcell-pitches 606 in the row direction. The layout of periphery circuit #1 inside boundary 652 includes one type of well, e.g., PP well 671, in a column 654 with the width of a bitcelll pitch 606 on the left and having n-type transistors MN1 and MN2. The n-type transistors MN1 and MN2 have two fins 672 and one gate (PO) 674. The Layout of periphery circuit #1 inside boundary 652 also includes another type of well, e.g., NP well 670, in column 655 with the width of a bitcelll pitch 606 on the right and having p-type transistors MP1 and MP2. The PP well portion of the periphery circuit #1 inside boundary 652 is consistent with PP well 602 of FIG. 6A and NP well portion of the periphery circuit #1 inside boundary 652 is consistent with NP well 604 of FIG. 6A. Thus, in each column (bitcelll pitch 606) of the boundary 652 that includes the periphery circuit #1 a single type of well exists. In some embodiments, implantation spacing cost is incurred inside one column (one bitcell-pitch 606) when multiple types of well exist inside the width of one column because extra space is added between different types of well. Similarly, implantation spacing cost is incurred along the length of one column, e.g., along the length of column 654 or 655, when multiple types of well exist along the length of one column and because extra space is added between different types of well. As shown in FIG. 6B, the layout 650 is formed with each column having a single type of NP or PP well and thus inside each column the implantation spacing cost is not incurred along the width of the column. Additionally, because in the horizontal direction, the columns 655 and 656 are of the same well type, the spacing cost in the horizontal direction between columns 655 and 656 is avoided. Thus, as shown in FIG. 6B, four periphery circuits (e.g., #1, #2, #5 and #6), which are consistent with periphery circuits 5 can vertically fit in vertical distance 658 that has the length of 10 contacted gate pitch (CPP), where a CPP is a distance 659 between two consecutive PO (gate) lines 674. As also shown in FIG. 6B, the upper half of the layout 650 is consistent with FIG. 6A and includes four periphery circuits, #1, #2, #3, and #4, where the periphery circuit #1 (inside boundary 652) and the periphery circuit #4 (inside boundary 651) are in the first row and the periphery circuit #2 (inside boundary 653) and the periphery circuit #3 are in the second row. The layout 650 also shows that column 655 has an n-type well, NP well 670, and also shows that both columns 654 and 655 include fin regions 672 and PO lines 674 connected to the gates of the fin regions 672. In addition, the layout 650 also shows gate cut (CPO) 676 at the border of wells to divide a continuous gate pattern into multiple isolated gate patterns. In some embodiments, other fins exist at the left and right edges under boundary 652 (not shown) and thus the transistors MN1, MN2, MP1, and MP2 have more fins than described above. As shown, the periphery circuit #4 (inside boundary 651) has an NP well 670 on the left, of the same well type of the periphery circuit #1 on the right side of the boundary 652, and a PP well 671 on the right side of the boundary 651. FIG. 6B additionally show a group 662 of two or three fins in column 654 in the PP well 671 and a group 661 of three or four fins in the column 655 in the NP well 670.

FIG. 6C schematically illustrates the arrangement of regions of four bitcells, bit lines, and four SRAM periphery circuits according to some embodiments. Consistent with FIG. 6A, FIG. 6C shows four SRAM periphery circuits #1, #2, #3, and #4, which each one is consistent with periphery circuit 5. Also consistent with FIG. 6A, FIG. 6C shows four bitcells, bitcell number 1 (BC-1), bitcell number 2 (BC-2), bitcell number 3 (BC-3), and bitcell number 4 (BC-4). Again consistent with FIG. 6A, each SRAM periphery circuit of FIG. 6C spans in two bitcell-pitches 606 and occupies two adjacent columns in a row with each column having a single type of well. In some embodiments, periphery circuit #1 is associated with the bitcell BC-1 and occupies cell 602 having PP well 671 and including transistors MN1 and MN2 and cell 604 having NP well 670 and including transistors MP1 and MP2. Periphery circuit #2 is associated with the bitcell BC-2 and occupies cell 682 having PP well 671 and including transistors MN1 and MN2 and cell 684 having NP well 670 and including transistors MP1 and MP2. Periphery circuit #3 is associated with the bitcell BC-3 and occupies cell 686 having PP well 671 and including transistors MN1 and MN2 and cell 688 having NP well 670 and including transistors MP1 and MP2. Periphery circuit #4 is associated with the bitcell BC-4 and occupies cell 690 having PP well 671 and including transistors MN1 and MN2 and cell 692 having NP well 670 and including transistors MN1 and MN2.

In some embodiments, the bit lines BL[0] and BLB [0] corresponding to the bitcell BC-1 pass through cell 602 (a PP well) of periphery circuit #1 and connects to the elements of cell 602 but does not pass through cell 604. Thus, the elements of cell 604 connect to the bit lines BL[0] and BLB[0] via connection lines MD1, which are consistent with the connection lines MD discussed above with respect to FIG. 6A. Similarly, the bit lines BL[1] and BLB[1] corresponding to the bitcell BC-2 pass through cell 684 of periphery circuit #2 and connects to the elements of cell 684 but does not pass through cell 682. Thus, the elements of cell 682 connect to the bit lines BL[1] and BLB[1] via connection lines MD2, which are consistent with the connection lines MD. Also, the bit lines BL[2] and BLB [2] corresponding to the bitcell BC-3 pass through cell 688 of periphery circuit #3 and connects to the elements of cell 688 but does not pass through cell 686. Thus, the elements of cell 686 connect to the bit lines BL[2] and BLB[2] via connection lines MD3, which are consistent with the connection lines MD. In addition, the bit lines BL[3] and BLB [3] corresponding to the bitcell BC-4 pass through cell 690 of periphery circuit #4 and connects to the elements of cell 690 but does not pass through cell 692. Thus, the elements of cell 692 connect to the bit lines BL[3] and BLB[3] via connection lines MD4, which are consistent with the connection lines MD. As can be seen in FIG. 6C, the p-active well regions, PP wells 671, are arranged in a single column and the n-active well regions, NP wells 670, are arranged in a single column and thus no extra spacing exists at location 620 between the cells of a column. As described, an n-type transistor of cell 602 may directly connect to bit lines BL[0] and BLB[0], which pass through cell 602, however, a p-type transistor of cell 604 (an NP well) may connect to bit lines BL[0] and BLB [0] through connection lines MD1 that extend between cells 602 and 604. A p-type transistor of cell 684 may directly connect to bit lines BL[1] and BLB[1], which pass through cell 684, however, an n-type transistor of cell 682 may connect to bit lines BL[1] and BLB[1] through connection lines MD2 that extend between cells 682 and 684. A p-type transistor of cell 688 may directly connect to bit lines BL[2] and BLB[2], which pass through cell 688, however, an n-type transistors of cell 686 may connect to bit lines BL[2] and BLB [2] through connection lines MD3 that extend between cells 686 and 688. An n-type transistor of cell 690 may directly connected to bit lines BL[3] and BLB[3], which pass through cell 690, however, a p-type transistors of cell 692 may connect to bit lines BL[3] and BLB[3] through connection lines MD4 that extend between cells 690 and 692. In some embodiments, the cells 602, 604, 682, 684, 686, 688, 690, and 692 each have the width of one bitcell-pitch 606.

In some embodiments and returning to FIGS. 6B and 6C, the first column 654 includes the bitcell BC-1 of the bitcell array 610 and the first and second columns 654 and 655 include the periphery circuit #1 of the periphery circuit array 608 that is associated with the bitcell BC-1 of the bitcell array 610. In some embodiments, the bit line BL[0] and the complementary bit line BLB [0] extend via first connection lines over the first column 654 and connect the bitcell BC-1 in the first column 654 to one or more transistors of the periphery circuit #1 in the cell 602 (a PP well) in the first column 654. One or more of second connection lines MD1 extend between the first and second columns 654 and 655 over the periphery circuit #1 and connect the bit line BL[0]

and the complementary bit line BLB[0] to one or more transistors of the periphery circuit #1 in the cell 604 in the second column 655.

In some embodiments and returning to FIGS. 6B and 6C, the second column, e.g., column 655 of FIG. 6B, includes a the bitcell BC-2 of the bitcell array 610, such that the first and second columns 654 and 655 include the periphery circuit #2 of the periphery circuit array 608 that is associated with the bitcell BC-2, In some embodiments, the bit line BL[1] and the complementary bit line BLB[1] extend via the first connection lines over the second column 655 and connect the bitcell BC-2 in the second column 655 to one or more transistors of the periphery circuit #2 in the cell 684 in the second column 655. One or more of the second connection lines MD2 extend between the second 655 and first 654 columns over the periphery circuit #2 and connect the bit line BL[1] and the complementary bit line BLB[1] to one or more transistors of the periphery circuit #2 in the cell 682 of the first column 654. The local interconnect layer and the connection lines are described above with respect to FIG. 6A.

Figure 7:
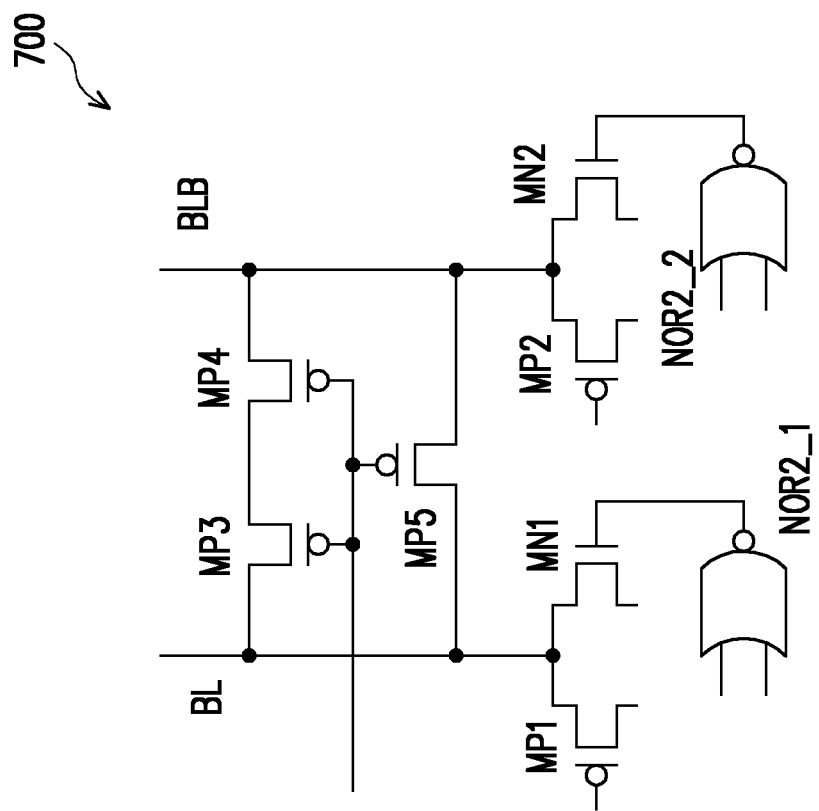
FIG. 7 is an exemplary circuit diagram of an SRAM periphery circuit according to some embodiments.

In some embodiments, the fourth column, e.g., column 657 of FIG. 6B, includes a fourth bitcell of the SRAM array, the third and fourth columns 656 and 567 include the fourth SRAM periphery circuit of the fourth bitcell, As shown in FIG. 6C, fourth bit line BL[3] and a fourth complementary bit line BLB[3] extend in the first conductive layer over the fourth column and connect the fourth bitcell in the fourth column to one or more transistors of the fourth SRAM periphery circuit in cell 690 of the fourth column. One or more connection lines MD4 extend in the second conductive layer between the fourth and third columns over the fourth SRAM periphery circuit and connect the fourth bit line BL[3] and the fourth complementary bit line BLB[3] to one or more transistors of the second SRAM periphery circuit in the third column. FIG. 7 is an exemplary circuit diagram of an SRAM periphery circuit 700 according to some embodiments. In an embodiment, the SRAM periphery circuit 700 is a multiplexer, e.g., a column-multiplexer, and includes a set of three p-type transistors MP3, MP4 and MP5 to form a bit line precharging circuit. The gates of each of the p-type transistors MP3, MP4 and MP5 are connected to each other, while a first terminal of the MP3 and MP5 is connected to a bit line BL, and a second terminal of MP4 and MP5 is connected to a complementary bit line BLB of the respective column bitcell. The second terminal of MP3 and first terminal of MP4 are connected to each other. The SRAM bitcell periphery circuit further includes two additional p-type transistors MP1 and MP2 and two n-type transistors MN1 and MN2, having first terminals connected respectively to bit line BL and complementary bit line BLB. The gates of MN1 and MN2 are respectively connected to outputs of corresponding NOR circuits NOR2_1 and NOR2_2. The SRAM periphery circuit as a whole may function a bit line conditioning circuit as well as a bit line decoder circuit. In some embodiments, each one of the NOR circuits NOR2_1 and NOR2_2 are consistent with periphery circuit 5 (NOR circuit) of FIG. 5. In some embodiments, periphery circuit 700 decodes, e.g., detects, a content of a cell such as SRAM bitcell 3, based on bit lines BL and BLB of SRAM bitcell 3. In some embodiments, periphery circuit 700 performs signal conditioning such as amplification on the bit lines BL and BLB before detecting the content of the bitcell. In some examples, MP1 and MP2 are 5×1, having five fins and one finger (gate contact). MN1 and MN2 are 5×2, having five fins and two finger (gate contact). MP3, MP4, and MP5 are 5×1, having five fins and one finger (gate contact).

Figure 8:
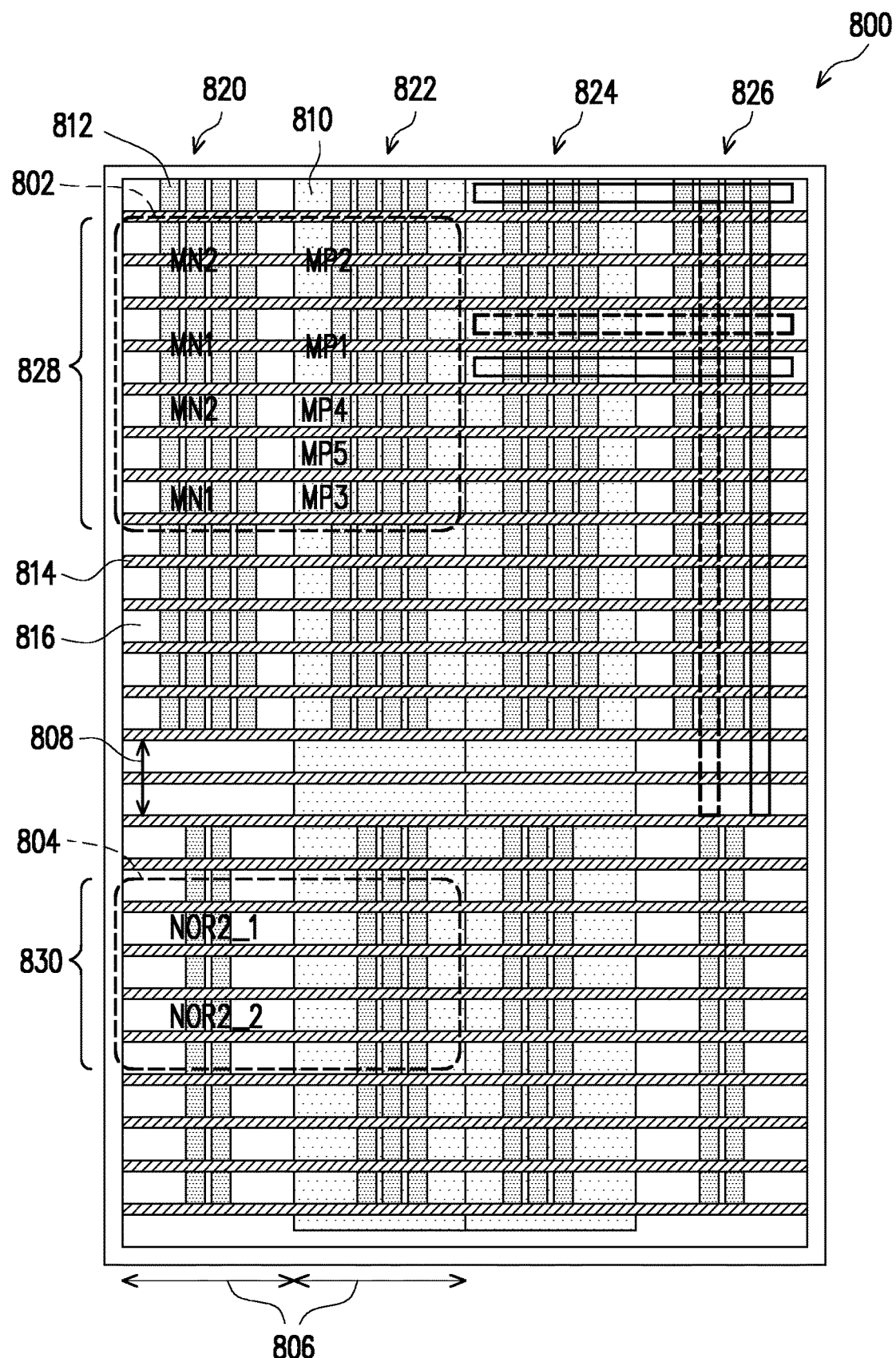
FIG. 8 shows layout of an SRAM periphery circuit according to some embodiments.

FIG. 8 shows layout 800 that includes an SRAM periphery circuit 700 of FIG. 7 using an N5 node. As can be seen in FIG. 8, layout 800 include columns 820 and 826 that include a single type of well, e.g., the p-active well region PP well and columns 822 and 824 that include a single type of well, e.g., the n-active well region NP well. Thus each column includes one well and layout 800 implements the 1-column-1-well layout. The 1-column-1-well layout saves the implantation spacing cost within the column, that may be required for separating the p-active well region PP well and n-active well region NP well when implementing two different well types in a single column in a 1-column-2-well layout. In some embodiments, the SRAM periphery circuit 700 of FIG. 7 may be implemented in two separate layouts, layout 828 designated by boundary 802 and layout 830 designated by boundary 804. As shown each layout 828 and 830 occupy two bitcell-pitches 806 in the row direction. As shown, layout 830 includes two NOR2 circuits NOR2-1 and NOR-2 where each NOR2 circuit is consistent with layout 675 of FIG. 6B. Despite each column being of the same well type, a gap 808 in column direction may exist in each column. In addition, layout 800 also shows columns 822 and 824 having an n-type well (NW) 810 and shows that all columns 820, 822, 824, and 826 have fins 812 and polysilicon connection lines (PO) 814 passing over to the gates. In some embodiments, gap 808 may be used for having connection lines and may have a length of 3 polysilicon pitches. In some embodiments, layouts 828 and 830 may be combined in cells 602 and 604 of FIG. 6C and thus the layout of four periphery circuits 700 may be formed as shown in FIG. 6C. The some embodiments or examples described herein offer several advantages over the existing art. For example, the embodiments disposed herein provide layout for an SRAM periphery circuit. The layout allows one type of active region within one column (1-column-1-well), thereby saving the implantation space required for separating two active regions when implementing 2 wells within one column (1-column-2-well).

In accordance with some aspects of the present disclosure, a circuit layout including at least a first layout of a first static random access memory (SRAM) periphery circuit includes a first n-type transistor and a second n-type transistor that are disposed in a first well region of first conductivity type, the first well region occupies a distance in a row direction that equals to a bitcell-pitch of an SRAM array. The SRAM periphery circuit includes a first p-type transistor and a second p-type transistor that are disposed in a second well region of second conductivity type. The second well region occupies a second distance in the row direction that equals to the bitcell-pitch of the SRAM array. The second well region is disposed adjacent to the first well region in a row direction.

In some embodiments, a first conducting layer is disposed over the first well region and the second well region and connects the first p-type transistor to the first bit line and the second p-type transistor to the first complementary bit line. In some embodiments, the first and second p-type transistors form a bit line precharging circuit for the first bit line and the first complementary bit line to precharge the first bit line and the first complementary bit line before the corresponding bitcell is read. In some embodiments, SRAM periphery circuit further includes a third p-type transistor and a fourth p-type transistor disposed in the second well region. The first and second n-type transistors and the third and fourth p-type transistors form a sense amplifier for the first bit line and the first complementary bit line to amplify the first bit line and the first complementary bit line signals before the bitcell is detected. In some embodiments, the SRAM periphery circuit further includes a first bit line equalizing p-type transistor disposed in the second well region for conditioning, e.g., equalizing the bit line before using sense amplifiers. The first conducting layer connects a first terminal of the first bit line equalizing p-type transistor to the first bit line and a second terminal of the first bit line equalizing p-type transistor to the first complementary bit line.

In some embodiments, the SRAM periphery circuit further includes a third n-type transistor and a fourth n-type transistor disposed in a third well region of the first conductivity type. The third well region is disposed adjacent to the first well region in the column direction with no additional, e.g., transitional, space between the first and third well regions as the two well regions are of the same type. A fifth p-type transistor and a sixth p-type transistor are disposed in a fourth well region of the second conductivity type. The fourth well region is disposed adjacent to the second well region in the column direction with no additional space between the second and fourth well regions and connected to a second bit line and a second complementary bit line both extending in the column direction. A second conducting layer is disposed over the third well region and the fifth well region connecting the fifth n-type transistor to the second bit line and the sixth n-type transistor to the second complementary bit line. In some embodiments, the fifth and the sixth p-type transistors form a bit line precharging circuit for the second bit line and the second complementary bit line to precharge the second bit line and the second complementary bit line before the corresponding bitcell is read.

In some embodiments, the SRAM periphery circuit further includes a seventh p-type transistor and an eighth p-type transistor disposed in the fourth well region. The third and fourth n-type transistors and the seventh and eighth p-type transistors form a sense amplifier for the second bit line and the second complementary bit line. In some embodiments, the SRAM periphery circuit further includes a second bit line equalizing p-type transistor disposed in the fourth well region. A first terminal of the second bit line equalizing p-type transistor is connected to the second bit line and a second terminal of the second bit line equalizing p-type transistor is connected to the second complementary bit line. In some embodiments, the SRAM periphery circuit further includes a NOR gate circuit coupled to a gate of each of the first and second n-type transistors. In some embodiments, the first and third well regions are continuous, with no additional space between the first and third well regions, with a first SRAM bitcell column having the first bit line and the first complementary bit line, and the second and fourth well regions are continuous, with no additional transitional space between the second and fourth well regions, with a second SRAM bitcell column having a second bit line and a second complementary bit line. The first SRAM bitcell column and the second SRAM bitcell column are disposed adjacent to each other in the row direction. In accordance with some aspects of the present disclosure, a circuit layout includes a first static random access memory (SRAM) periphery circuit that includes first and second n-type transistors that are disposed in a first well region of a first conductivity type. The first well region occupies a first distance in a row direction that equals to a bitcell-pitch of an SRAM array. The first SRAM periphery circuit includes first and second p-type transistors that are disposed in a second well region of a second conductivity type. The second well region occupies a second distance in the row direction equal to the bitcell-pitch. The second well region is disposed adjacent to the first well region in the row direction. The circuit layout includes a second SRAM periphery circuit that includes third and fourth n-type transistors that are disposed in a third well region of the first conductivity type. The third well region occupies a third distance in the row direction that equals to the bitcell-pitch of an SRAM array. The second SRAM periphery circuit includes third and fourth p-type transistors that are disposed in a fourth well region of the second conductivity type. The fourth well region occupies a fourth distance in the row direction equal to the bitcell-pitch. The fourth well region is disposed adjacent to the third well region in the row direction. The third well region is disposed next to the first well region in a column direction in a first column and the fourth well region is disposed next to the second well region in the column direction in a second column adjacent to the first column. Also, the first and third well regions are of the same type and the second and fourth well regions are of the same type with no additional (transitional) spaces between the first and third well regions in the first column and the second and fourth well regions in the second column.

In accordance with some aspects of the present disclosure, a circuit layout includes, a first static random access memory (SRAM) periphery circuit that includes first and second n-type transistors that are disposed in a first well region of a first conductivity type. The first well region occupies a first distance in a row direction that equals to a bitcell-pitch of an SRAM array. The first SRAM periphery circuit includes first and second p-type transistors that are disposed in a second well region of a second conductivity type. The second well region occupies a second distance in the row direction equal to the bitcell-pitch. The second well region is disposed adjacent to the first well region in the row direction. The circuit layout includes a second SRAM periphery circuit that includes third and fourth p-type transistors that are disposed in a fourth well region of the second conductivity type. The fourth well region occupies a fourth distance in the row direction that equals to the bitcell-pitch of an SRAM array. The second SRAM periphery circuit includes third and fourth n-type transistors that are disposed in a third well region of the first conductivity type. The third well region occupies a third distance in the row direction equal to the bitcell-pitch. The fourth well region is disposed adjacent to the second well region in the row direction. The third well region is disposed next to the fourth well region in the row direction. Also, the second and fourth well regions are of the same type with no additional (transitional) space between the second and fourth well regions in the second column and third columns.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit layout comprising:
   a first layout circuit comprising:
   a first n-type transistor and a second n-type transistor disposed in a first p-type doped region; and
   a first p-type transistor and a second p-type transistor disposed in a first n-type doped region,
   wherein the first n-type doped region is disposed immediately adjacent to the first p-type doped region in a first direction;
   a second layout circuit diagonally located with respect to the first layout circuit, the second layout circuit comprising:
   third and fourth p-type transistors disposed in a second n-type doped region,
   wherein the second n-type doped region is diagonally arranged with the first n-type doped region; and
   third and fourth n-type transistors disposed in a second p-type doped region,
   wherein the second p-type doped region is immediately adjacent to the second n-type doped region,
   wherein the second n-type doped region is diagonal to the first n-type doped region, and
   wherein there is no transitional space between the second n-type doped region and the first n-type doped region.

2. The circuit layout of claim 1, wherein the first and second n-type transistors and the first and second p-type transistors comprise a first NOR circuit.

3. The circuit layout of claim 1, further comprising:
   a fifth n-type transistor and a sixth n-type transistor disposed in the first p-type doped region; and
   a fifth p-type transistor and a sixth p-type transistor disposed in the first n-type doped region,
   wherein the fifth and sixth n-type transistors and the fifth and sixth p-type transistors comprise a second NOR circuit.

4. The circuit layout of claim 1, further comprising a third layout circuit disposed in a third p-type doped region and a third n-type doped region, wherein the third p-type doped region is adjacent to the first p-type doped region along the second direction, and the third n-type doped region is adjacent to the first n-type doped region along the second direction.

5. The circuit layout of claim 4, wherein there is no transitional space between the third p-type doped region and the first p-type doped region along the second direction, and no transitional space between the third n-type doped region and the first n-type doped region along the second direction.

6. The circuit layout of claim 4, further comprising a first bit line and a first complementary bit line extending along the second direction disposed in a conductive layer over the first p-type doped region and the third p-type doped region.

7. The circuit layout of claim 6, further comprising a second bit line and a second complementary bit line extending along the second direction disposed in the conductive layer over the first n-type doped region and the third n-type doped region.

8. The circuit layout of claim 4, further comprising a fourth layout circuit disposed in a fourth p-type doped region and a fourth n-type doped region, wherein the fourth n-type doped region is adjacent to the first n-type doped region along the first direction, and the fourth p-type doped region is adjacent to the fourth n-type doped region along the first direction.

9. The circuit layout of claim 8, wherein there is no transitional space between the first n-type doped region and the fourth n-type doped region along the first direction.

10. A circuit layout comprising:
    a first layout circuit comprising:
    a first n-type transistor and a second n-type transistor disposed in a first p-type doped region; and
    a first p-type transistor and a second p-type transistor disposed in a first n-type doped region of a second conductivity type,
    wherein the first n-type doped region is disposed immediately adjacent to the first p-type doped region along a first direction;
    a second layout circuit located immediately adjacent and diagonally with respect to the first layout circuit, the second layout circuit comprising:
    third and fourth p-type transistors disposed in a second n-type doped region, the second n-type doped region is diagonally arranged with the first n-type doped region;
    third and fourth n-type transistors disposed in a second p-type doped region,
    wherein the second p-type doped region is immediately adjacent to the second n-type doped region;
    a first bit line and a second bit line complementary to the first bit line, both extending in a second direction perpendicular to the first direction and coupled to one or more transistors along the second direction; and
    a third bit line and a fourth bit line complementary to the third bit line, both extending in the second direction and coupled to one or more transistors along the second direction.

11. The circuit layout of claim 10, wherein the first and second n-type transistors and the first and second p-type transistors comprise a NOR circuit.

12. The circuit layout of claim 10, wherein the first, second, third, and fourth n-type transistors have 3 fins and one gate.

13. The circuit layout of claim 10, wherein the first, second, third, and fourth p-type transistor have 4 fins and one gate.

14. The circuit layout of claim 10, further comprising a third layout circuit comprising:
    a fifth n-type transistor and a sixth n-type transistor disposed in a third p-type doped region; and
    a fifth p-type transistor and a sixth p-type transistor disposed in a third n-type doped region,
    wherein the third p-type doped region is located immediately adjacent the third n-type doped region along the first direction, and
    the third p-type doped region is located immediately adjacent the first p-type doped region along the second direction.

15. The circuit layout of claim 10, further comprising a fourth layout circuit comprising:
    a seventh n-type transistor and an eighth n-type transistor disposed in a fourth p-type doped region; and
    a seventh p-type transistor and an eighth p-type transistor disposed in a fourth n-type doped region,
    wherein the fourth n-type doped region is located immediately adjacent the first n-type doped region along the first direction, and
    the fourth p-type doped region is located immediately adjacent the second p-type doped region along the second direction.

16. A circuit layout comprising:
    a first layout circuit comprising:

first and second n-type transistors disposed in a first p-type doped region; and first and second p-type transistors disposed in a first n-type doped region, wherein the first n-type doped region is disposed immediately adjacent to the first p-type doped region along a first direction;

a second layout circuit comprising:

third and fourth n-type transistors disposed in a second p-type doped region; and third and fourth p-type transistors disposed in a second n-type doped region, wherein the second n-type doped region is disposed immediately adjacent to the second p-type doped region along the first direction, the first p-type doped region and the second p-type doped region are arranged along a second direction perpendicular to the first direction, the first n-type doped region and the second n-type doped region are arranged along the second direction, and a transitional space exists between the first p-type doped region and the second p-type doped region and the first n-type doped region and the second n-type doped region.

17. The circuit layout of claim 16, wherein the first and second n-type transistors and the first and second p-type transistors comprise a NOR circuit.

18. The circuit layout of claim 16, wherein the third and fourth n-type transistors and the third and fourth p-type transistors comprise a NOR circuit.

19. The circuit layout of claim 16, wherein the first, second, third, and fourth n-type transistors have 3 fins and one gate.

20. The circuit layout of claim 16, wherein the first, second, third, and fourth p-type transistor have 4 fins and one gate.

* * * * *